(12) United States Patent
Makita

(10) Patent No.: US 6,759,256 B2
(45) Date of Patent: Jul. 6, 2004

(54) SEMICONDUCTOR FABRICATING METHOD EMPLOYING PARALLEL PROCESSING AND INSPECTION TECHNIQUES

(75) Inventor: Toshiyuki Makita, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/271,176

(22) Filed: Oct. 15, 2002

(65) Prior Publication Data

US 2003/0077151 A1 Apr. 24, 2003

(30) Foreign Application Priority Data

Oct. 19, 2001  (JP) ........................................ 2001-322072

(51) Int. Cl.⁷ .............................................. H01L 21/66
(52) U.S. Cl. ........................ 438/14; 414/940; 700/121
(58) Field of Search .......................... 438/14; 29/25.01; 414/222.07, 222.13, 937, 938, 940; 700/116, 121

(56) References Cited

U.S. PATENT DOCUMENTS

| | | | | |
|---|---|---|---|---|
| 5,113,992 A | * | 5/1992 | Sadamori ................. | 198/347.3 |
| 5,936,416 A | * | 8/1999 | Tanaka et al. .............. | 324/754 |
| 6,097,204 A | * | 8/2000 | Tanaka et al. .............. | 324/765 |
| 6,162,006 A | * | 12/2000 | Stevens et al. ......... | 414/416.03 |
| 6,303,394 B1 | * | 10/2001 | Steffan et al. ................ | 438/14 |
| 6,580,087 B1 | * | 6/2003 | Suzuki et al. ............ | 250/559.4 |
| 2002/0018217 A1 | * | 2/2002 | Weber-Grabau et al. .... | 356/601 |
| 2002/0021837 A1 | * | 2/2002 | Suzuki ....................... | 382/181 |
| 2002/0165636 A1 | * | 11/2002 | Hasan ........................ | 700/121 |

FOREIGN PATENT DOCUMENTS

JP          10-12694 A   *   1/1998    ........... H01L/21/68

* cited by examiner

Primary Examiner—Carl Whitehead, Jr.
Assistant Examiner—Stephen W. Smoot
(74) Attorney, Agent, or Firm—Robert J. Depke; Holland & Knight LLP

(57) ABSTRACT

A semiconductor fabricating method is disclosed. A first container accommodating a predetermined number of semiconductor wafers and labeled with a first identifier and a second container labeled with a second identifier are mounted on a first processing apparatus, and the first and second identifiers are stored. While the first processing apparatus is submitting the semiconductor wafers to a first process, designated ones of the processed wafers are loaded into the second container as sample wafers. The second container is mounted on an inspection apparatus to inspect the sample wafers. Then, the first and second containers are mounted on a second processing apparatus and are identified by comparison of identifiers thereof with the stored first and second identifiers, respectively. The second processing apparatus submits the rest of the processed semiconductor wafers and the inspected sample wafers to a second process, and the processed sample wafers are returned to the first container.

9 Claims, 9 Drawing Sheets

US 6,759,256 B2

SEMICONDUCTOR FABRICATING METHOD EMPLOYING PARALLEL PROCESSING AND INSPECTION TECHNIQUES

CROSS REFERENCE TO RELATED APPLICATIONS

The present document is based on Japanese Priority Document JP 2001-322072, filed in the Japanese Patent Office on Oct. 19, 2001, the entire contents of which being incorporated herein by reference.

BACKGROUND OF THE INVENTION

1. Field of the Invention

The present invention relates to a method of fabricating semiconductor devices by submitting, for example, semiconductor wafers to various semiconductor fabricating processes.

2. Background of Related Art

Semiconductor device fabrication involves patterning a semiconductor wafer via a thin film forming technique, such as evaporation or sputtering, to form many circuits on the wafer, and then dicing the patterned wafer into many semiconductor chips.

During the fabrication, inspection is performed by transfer of semiconductor wafers to inspection equipment between processes in order to manufacture high-quality products at high yield.

In a typical semiconductor fabricating practice, the processes are carried out on a cassette basis, with each cassette accommodating, for example, 25 (twenty-five) semiconductor wafers. Thus, once a process is finished, the 25 wafers are transferred en bloc as accommodated in the cassette to the inspection equipment for diagnosis.

FIG. 9 shows a flow of steps included in a conventional lithographic process.

First, in step ST101, a cassette in which a plurality of semiconductor wafers are accommodated is mounted on a loader/unloader of an in-line stepper used in the lithographic process.

Next, in step ST102, the in-line stepper submits these wafers to the lithographic process including resist coating, exposure and development, and then returns the resultant wafers to where they were in the cassette in order of their submission to the process.

The cassette is then delivered to inspection apparatuses, where the lithographically processed wafers have their pattern accuracy measured with a scanning electron microscope (SEM) (step ST104), their overlay accuracy evaluated (step ST105), and their surface visually checked to locate any damage thereon (step ST106).

Thus, the lithography process, among other semiconductor fabricating processes, involves a number of inspections including pattern accuracy, overlay accuracy and wafer surface visual checkup which demand time, sometimes longer than the lithography process itself.

However, in performing the inspections, the above conventional lithographic process, because of its cassette-based serial operation, prevents transfer of any wafer to the inspection apparatuses unless the lithographic process is completed for all the wafers in the cassette, thus making the process time-consuming.

In addition, this time-consuming cassette-based serial operation would greatly discourage productivity increase when combined with commonly practiced sampling inspection in which some of semiconductor wafers in a cassette are selected for inspection.

To overcome these problems, proposed to date are an in-line approach in which semiconductor fabricating apparatuses and inspection apparatuses are grouped in-line into a semiconductor fabricating system, and a monitoring approach in which inspection units are incorporated into semiconductor fabricating apparatuses.

However, the in-line approach is unable to balance varying throughputs among the apparatuses involved nor is it cost-effective, in consideration of factors such as sampling inspection being involved and the apparatuses being sensitive to external vibrations, etc. The monitoring approach would also be premature because individual element technologies currently available for semiconductor fabrication would be incompetent in accommodating inspection needs for high-volume production.

The fact that a number of steps, such as wafer surface checkup depends on visual inspection by a checker, is one major reason why the inspection is carried out after completion of the semiconductor fabrication process for all semiconductor wafers as described above.

SUMMARY OF THE INVENTION

The present invention solves the above and other problems by providing a semiconductor fabricating method capable of wafer inspection simultaneously with submission of semiconductor wafers to a semiconductor fabricating process to improve throughput, quality and yield.

In a first embodiment, the method of the present invention is carried out as follows. A first container accommodating a predetermined number of semiconductor wafers and labeled with a first identifier and a second container labeled with a second identifier are mounted on a first processing apparatus, and the first and second identifiers are stored.

While the first processing apparatus is submitting the semiconductor wafers to a first process, designated ones of semiconductor wafers on which the first process is performed are loaded into the second container as sample wafers. (Hereafter, the wafer for inspection is called a sample wafer).

The second container is mounted on an inspection apparatus to inspect the sample wafers.

The first container accommodating a rest of the processed semiconductor wafers after the first process is performed and the second container accommodating the inspected sample wafers are mounted on a second processing apparatus after the inspected sample wafers are judged to be acceptable, and the first and second containers mounted on the second processing apparatus are identified by comparison of identifiers thereof with the stored first and second identifiers, respectively.

The second processing apparatus submits the rest of the processed semiconductor wafers after the first process is performed and the inspected sample wafers to a second process, and the processed sample wafers by submission to the second process are returned to the first container.

In the step of loading designated ones of the processed semiconductor wafers into the second container as sample wafers, position information about where the sample wafers have been accommodated in the first container may be stored in association with the stored first and second identifiers of said first and second containers, and in the step of returning the inspected sample wafers to the first container, the stored position information based on the identifying of the second and first containers maybe read to return the inspected sample wafers to an original position in the first container.

In the step of inspecting the sample wafers, the identifier of the second container mounted on the inspection apparatus may be identified by comparison of the stored second identifier thereof with the second identifier and inspection results of the inspected sample wafers as inspection results of the processed semiconductor wafers accommodated in the first container may be stored.

According to this embodiment, the identifiers of the respective containers are stored before processing, and while the first processing apparatus is submitting the semiconductor wafers to the first process, some processed wafers are loaded into the second container as sample wafers. Then, these sample wafers are inspected by the inspection apparatus while the rest of the semiconductor wafers in the first container are continuously submitted to the first process.

When the inspected wafers are found to be acceptable, both the first container accommodating the rest of the semiconductor wafers for which the first process has finished, and the second container accommodating the inspected sample wafers are mounted on the second processing apparatus for subsequent processing.

During the mounting, the first and second containers mounted on the second processing apparatus are identified by comparing identifiers thereof with the previously stored identifiers, respectively, to confirm that the sample wafers have been taken out of the first container.

The second processing apparatus submits the rest of the semiconductor wafers and the sample wafers to the second process, and the processed sample wafers are put back to the first container, whereby the predetermined number of semiconductor wafers is back in the first container.

In this way, parallel operation is implemented through management of the sample wafers in the second container being taken out of the first container.

In a second embodiment, the method of the present invention is carried out as follows. A first container accommodating a predetermined number of semiconductor wafers and labeled with a first identifier and a second container labeled with a second identifier are mounted on a processing apparatus, and the first and second identifiers are stored.

While the processing apparatus is processing the semiconductor wafers, designated ones of the processed semiconductor wafers are loaded into the second container as sample wafers.

The second container accommodating the sample wafers and the first container accommodating a rest of the processed semiconductor wafers are mounted on an inspection apparatus, and the second and first containers mounted on the inspection apparatus are identified by comparison of identifiers thereof with the stored second and first identifiers, respectively.

The inspection apparatus inspects the sample wafers, and the inspected sample wafers are returned to the first container.

The steps of loading designated ones of the processed semiconductor wafers into the second container as sample wafers, returning the inspected sample wafers to the first container, and inspecting the sample wafers may be modified as mentioned in the first embodiment.

The second container may be mounted on another inspection apparatus after the designated ones of the processed semiconductor wafers are loaded into the second container as the sample wafers and before the second container having therein the sample wafers and the first container accommodating the rest of the processed semiconductor wafers are mounted on the inspection apparatus so as to carry out another inspection on the sample wafers.

According to this embodiment, the identifiers of the respective containers are stored before processing, and while the processing apparatus is submitting the semiconductor wafers to a predetermined process, some processed wafers are loaded into the second container as sample wafers. These sample wafers in the second container may undergo a plurality of inspections, for example.

When the processing apparatus completes its processing for the rest of the semiconductor wafers in the first container during the course of any of the inspections, the first container accommodating the rest of the processed semiconductor wafers and the second container accommodating the sample wafers are mounted on an inspection apparatus.

At the time of the mounting, the first and second containers are identified by comparison of identifiers thereof with the previously stored identifiers, respectively, to confirm that the sample wafers in the second container come from the first container.

Then, the inspection apparatus inspects the sample wafers, and the inspected wafers are thereafter put back to the first container after completion of all the inspections so that all the semiconductor wafers are back in the first container.

In this way, parallel operation of fabrication process and inspection process can be accomplished through confirmation of the sample wafers in the second container coming from the first container.

According to the present invention, wafer processing and wafer inspection can be carried out simultaneously, whereby throughput, quality and yield can be improved.

BRIEF DESCRIPTION OF THE DRAWINGS

The above and other objects, features and advantages of the present invention will become more apparent from the following description of the presently preferred exemplary embodiments of the present invention taken in conjunction with the accompanying drawings, in which.

DESCRIPTION OF THE PREFERRED EMBODIMENTS

The following description refers to some preferred embodiments of the present invention which provides an improved semiconductor fabricating method featuring parallel operation applicable to various semiconductor fabricating processes.

The preferred embodiments will be disclosed by taking a lithography process, inter alia, and an in-line stepper for use in the lithography process as examples, while describing system configuration, operation and procedure with reference to the attached drawings.

Figure 1:
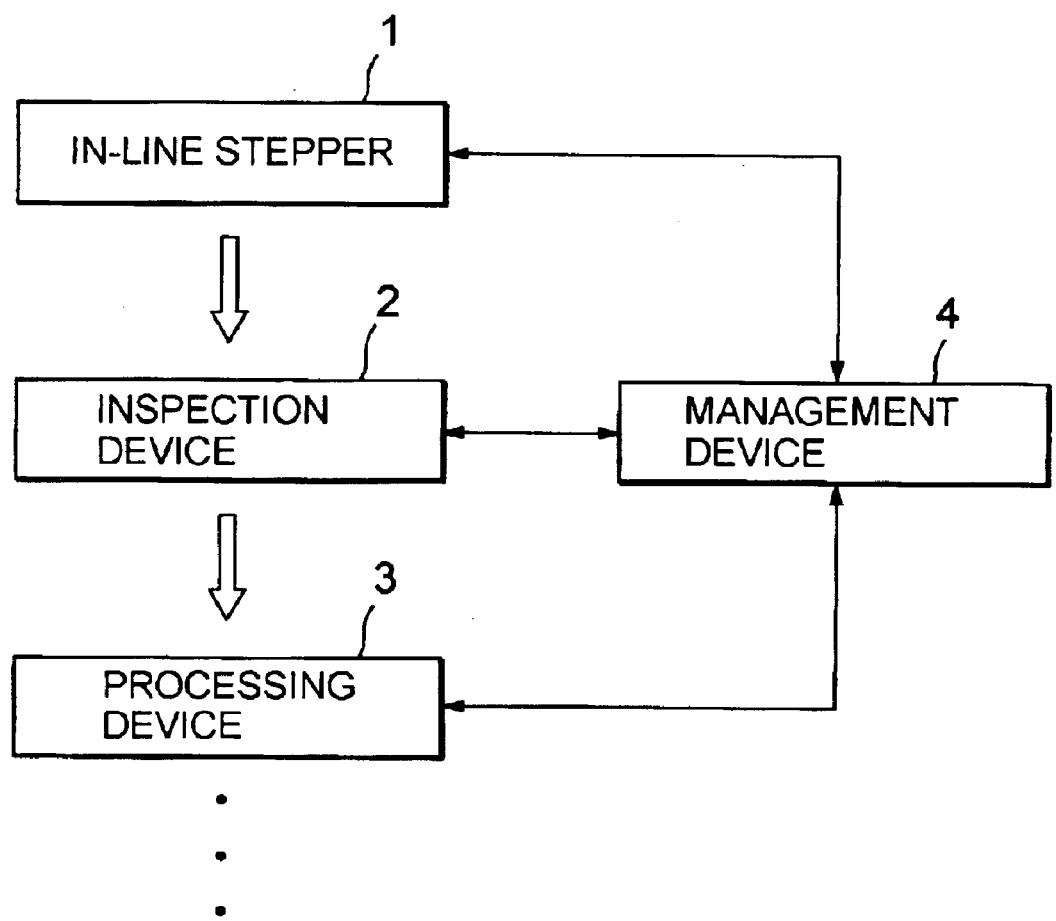
FIG. 1 schematically shows a configuration of a semiconductor fabricating system for implementing a semiconductor fabricating method, according to an embodiment of the present invention.

As shown in FIG. 1, a semiconductor fabricating system used in a semiconductor fabricating method, according to a preferred embodiment of the present invention comprises an in-line stepper 1 for use in a lithography process, an inspection device 2 that diagnoses patterns formed by the in-line stepper 1, a processing device 3 that performs a subsequent process, and other device s (not shown) for further succeeding processes. The in-line stepper 1, inspection device 2 and processing device 3 can exchange data with a management device 4 such as a host computer.

Semiconductor wafers are delivered to and processed by the in-line stepper 1, inspection device 2 and processing device 3, as either accommodated in a cassette (typically in a group of 25 wafers or so) or housed in a closed container as accommodated in a cassette.

It is to note that the following embodiments are based on semiconductor wafers processed as accommodated in a cassette.

Figure 2:
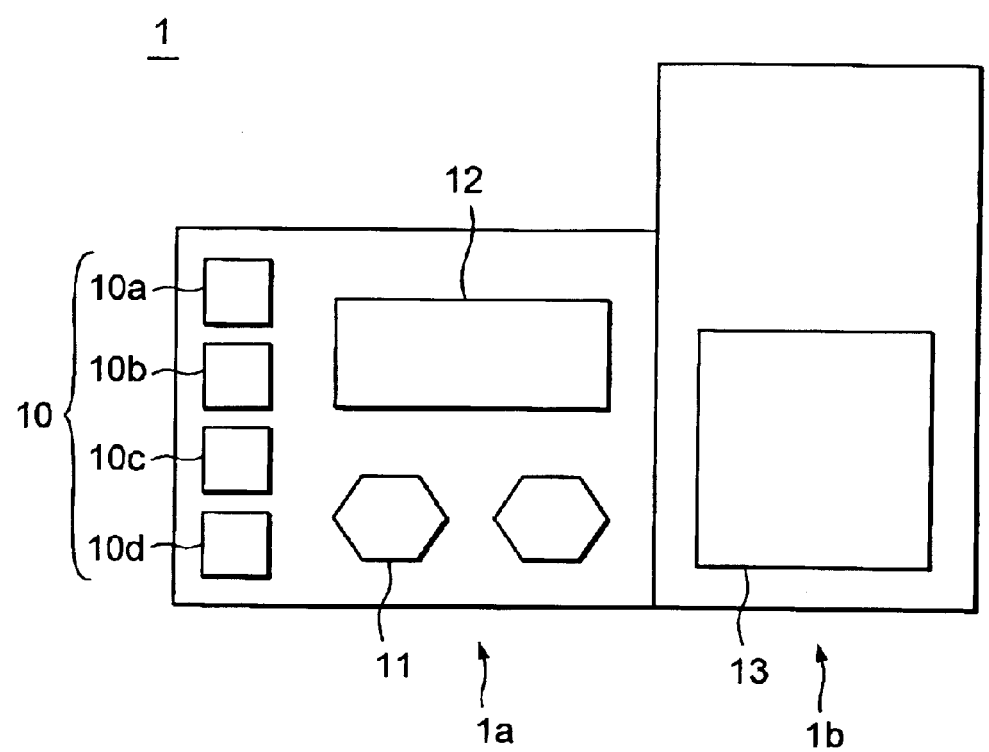
FIG. 2 sketches a configuration of an in-line stepper used in the semiconductor fabricating method, according to the embodiment of the present invention.
Figure 3:
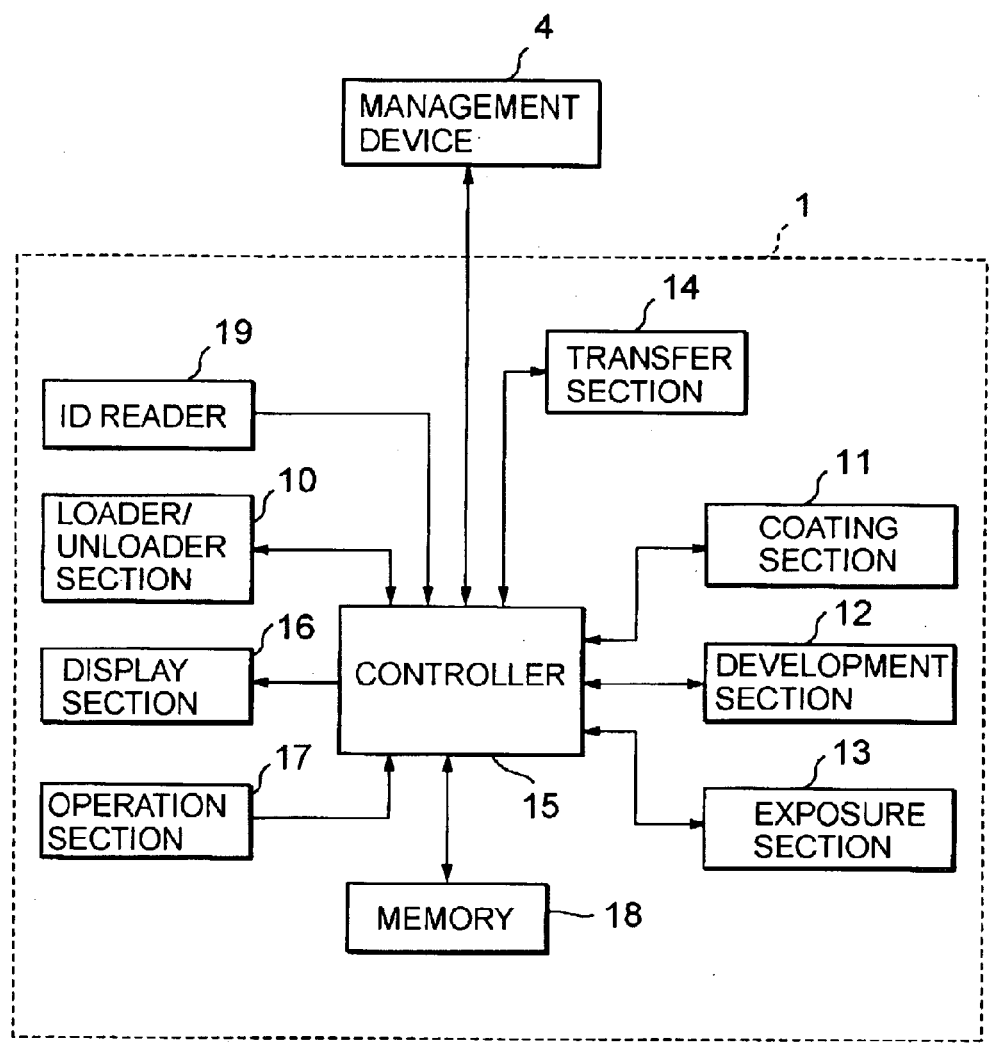
FIG. 3 shows in a block form the in-line stepper of the embodiment.

As illustrated in FIGS. 2 and 3, the in-line stepper 1 used in the semiconductor fabricating method, according to a preferred embodiment of the present invention includes a coater/developer 1a and a stepper 1b arranged in-line. More specifically, the in-line stepper 1 includes a loader/unloader section 10, a coating section 11, a development section 12, an exposure section 13, a transfer section 14, and a control unit including a controller 15 responsible for controlling the above sections 10 to 14.

The loader/unloader section 10, including four loaders/unloaders 10a to 10d and located at one end of the coater/developer 1a, can accommodate up to four cassettes, for example.

The coating section 11, comprised of, for example, spin coaters and arranged in the coater/developer 1a, applies a desired liquid photoresist or other material in droplets onto a semiconductor wafer and then rotates it at a desired rotation speed to achieve substantially evenly applied coating over the entire surface of the semiconductor wafer.

The development section 12, comprised of, for example, a spin developer arranged in the coater/developer 1a, applies a developer solution onto an exposed semiconductor wafer and then rotates it at desired speed to implement uniform development, and also removes the developer solution from the resultant wafer.

The exposure section 13, located in the stepper 1b, exposes a resist-coated semiconductor wafer processed in the coating section 11, for example, stepping the wafer relative to a projected image of a mask pattern repeatedly.

The transfer section 14 includes a transfer robot, etc. (not shown) that takes semiconductor wafers out of a cassette mounted on the loader/unloader section 10 one at a time, passes each wafer to the coating section 11, exposure section 13, development section 12 in this order, and puts each developed wafer back to the cassette.

The control unit serving for the above sections 10 through 14 includes the controller 15 comprised of, for example, a microcomputer as its main component, along with a display section 16, an operation section 17, a memory 18 and an ID reader 19.

The display section 16 provides visual information such as various settings on a display panel thereof as well as audible information such as warnings with, for example, a buzzer or a signal tower thereof, as instructed by the controller 15.

The operation section 17 is provided with assorted setting switches, a ten-key board, etc. so that an operator can enter processing information according to the kind of wafer to be processed, the kind of photoresist to be coated, etc.

The memory 18 stores process program related to process sequence and control parameter executed to control the sections 11 to 13 when these sections perform the lithographic process, for example.

The ID reader 19, which comprises, for example, a bar code reader, reads a lot ID of a cassette (each of a side surface of cassette is so labeled as described below) before the cassette is mounted on the loader/unloader section 10, and also sends the read lot ID to the controller 15.

The controller 15 is coupled, via a bus, to each of the loader/unloader section 10, coating section 11, development section 12, exposure section 13 and transfer section 14 for bidirectional data communication.

The controller 15 synthetically controls the in-line stepper 1 so that the stepper 1 can perform its various process steps under prescribed sequencing and conditions, by supplying control information to the respective sections 11 to 14 based on relevant switch settings on the operation section 17 and wafer specifications recorded in the memory 18.

Receiving cassette IDs from the ID reader 19, the controller 15 informs the management device 4 of the ID of any cassette ready to be processed.

The management device 4, which is briefly referred to above, is responsible for managing processing and inspection information about semiconductor wafers, and is hence communicatable with the controller 15 to give it specific control instructions.

In the in-line stepper 1 having the above configuration, after mounting a cassette accommodating semiconductor wafers on the loader/unloader section 10, the transfer robot (not shown) of the transfer section 14 takes a wafer out of the cassette and forwards the wafer to the coating section 11, exposure section 13 and development section 12, where the wafer is coated with the photoresist or other material, exposed and developed, respectively, in sequence.

Then, the wafer having resist or like pattern formed thereon after the development process in the development section 12 is returned to where it was in the cassette on the loader/unloader section 10 by the transfer section 14.

The above steps are repeated for each of the rest of the semiconductor wafers in the cassette.

In the above in-line stepper 1, it is arranged such that a cassette accommodating semiconductor wafers for processing is mounted on one loader/unloader 10a and an empty cassette on another loader/unloader 10b to allow some wafers selected as sample wafers to be loaded into the empty cassette after inspection when the controller 15 is so instructed by the management device 14.

The semiconductor fabricating method according to the present invention utilizing this arrangement and the ID reader 19 will be described below.

Figure 4:
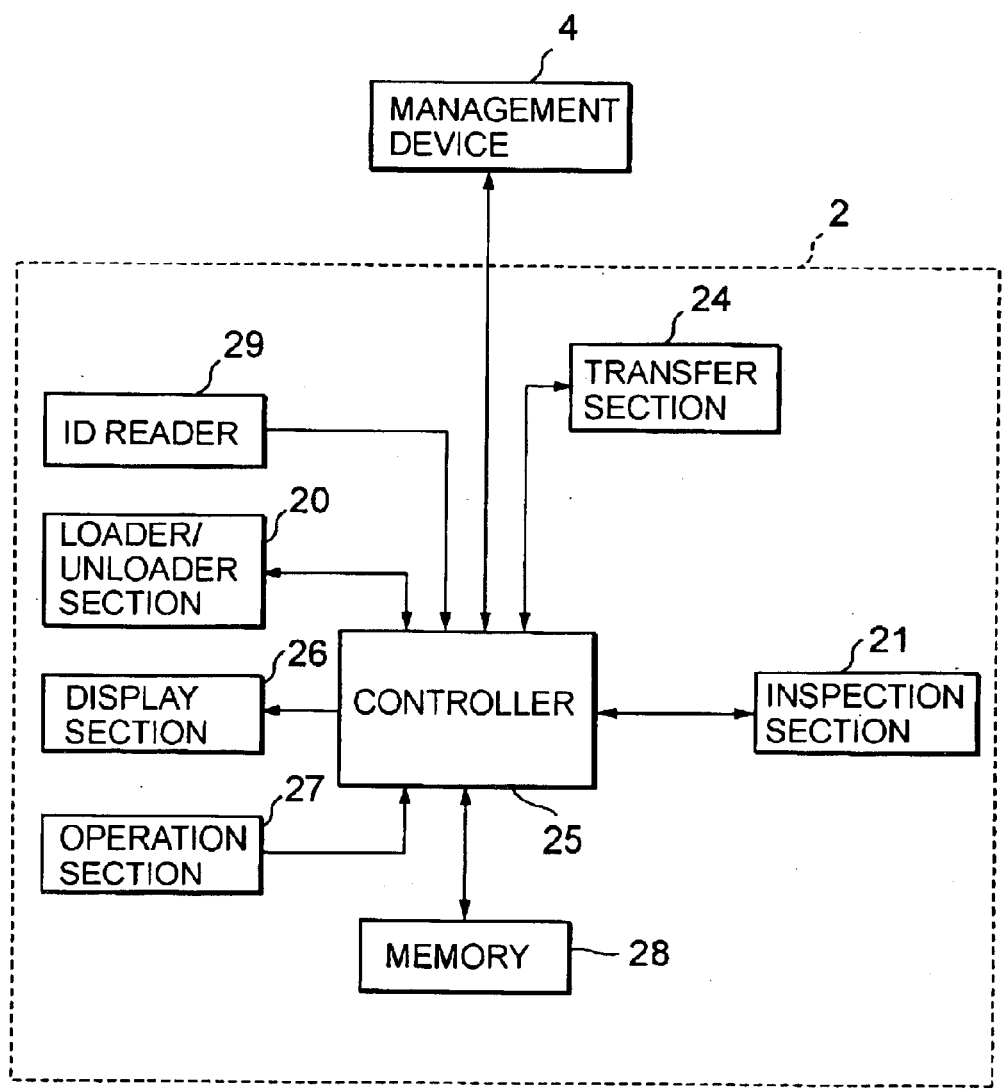
FIG. 4 shows in a block form an inspection device used in the semiconductor fabricating method, according to the embodiment of the present invention.

Referring now to FIG. 4, the inspection device 2 used in the semiconductor fabricating method, according to the preferred embodiment of the present invention will be described. The inspection device 2 comprises a loader/unloader section 20, an inspection section 21 and a transfer section 24, which are governed by a control unit having a controller 25 as a main component.

Although FIG. 4 depicts only one inspection device, multiple inspection devices are provided to perform multiple inspections (to be described below) typically involved in the lithographic process performed by the in-line stepper 1.

The loader/unloader section 20 should include at least two loaders/unloaders to implement the semiconductor fabricating method according to the present invention, as will be described below.

The inspection section 21 performs inspection such as pattern accuracy measurement with a SEM, overlay accuracy evaluation and visual surface checkup, whose techniques are so well known that they will not be herein detailed.

The transfer section 24 includes a transfer robot, etc. (not shown) that takes some semiconductor wafers out of a cassette mounted on the loader/unloader section 20 one at a time as sample wafers for delivery to the inspection section 21, and returns the inspected wafers to the cassette on the loader/unloader section 20.

The control unit configured to control the above sections 20, 21 and 24 includes the controller 25 composed of, for example, a microcomputer as its main component, in addition to a display section 26, an operation section 27, a memory 28 and an ID reader 29.

The display section 26 provides visual information such as various settings on a display panel thereof as well as audible information such as warnings using, for example, a buzzer or a signal tower arranged therein, as so instructed by the controller 25.

The operation section 27 is provided with assorted setting switches, a ten-key board, etc. so as to enable an operator to enter processing information according to the kind of sample wafer to be inspected, the kind of photoresist previously coated, etc.

The memory 28 stores programs for various inspection processing, for example.

The ID reader 29, which can be a bar code reader, reads a lot ID with which a cassette is labeled (as described below) before the cassette is set on the loader/unloader section 20, and informs the controller 25 of the read lot ID.

The controller 25, coupled via a bus to each of the loader/unloader section 20, inspection section 21 and transfer section 24 to allow bidirectional data communication, controls the overall operation of the inspection device by supplying specific information to the above sections based on relevant switch settings on the operation section 27 and sample wafer specifications recorded in the memory 28.

In receipt of cassette IDs from the ID reader 29, the controller 25 sends the ID of any cassette ready to be inspected to the management device 4.

As mentioned above, the management device 4 handles various processing and inspection information about semiconductor wafers, and thus can communicate also with the controller 25 to give proper control instructions.

In one of the inspection device s 2 having the above configuration, when a cassette containing semiconductor wafers including sample wafers is mounted on its loader/unloader section 20, the transfer robot (not shown) of its transfer section 24 takes the sample wafers out of the cassette, and then transfers them to its inspection section 21, where the sample wafers are inspected as specified. The inspected wafers are then returned to a predetermined cassette on the loader/unloader section 20 by the transfer section 24. Then, the predetermined cassette is mounted on a similar loader/unloader section of another inspection device to undergo another inspection, after which the inspected sample wafers are put back to the predetermined cassette.

The lithographic process performed by the in-line stepper 1 usually employs three inspection devices, of which a first inspection device measures pattern accuracy with a SEM, a second inspection device evaluates overlay accuracy, and a third inspection device is used for visual surface checkup to find any damage. These inspections are repeated for each of the sample wafers in the cassette.

Similar to the in-line stepper 1, it is arranged in each inspection device 2 such that a cassette accommodating semiconductor wafers including sample wafers is mounted on one of the loaders/unloaders 20 and an empty cassette on another one of the loaders/unloaders 20 to allow the sample wafers to be put back to the empty cassette after inspection when the management device 4 so directs the controller 25.

The semiconductor fabricating method according to the present invention based on this arrangement combined with the ID reader 29 will be described below.

Figure 5:
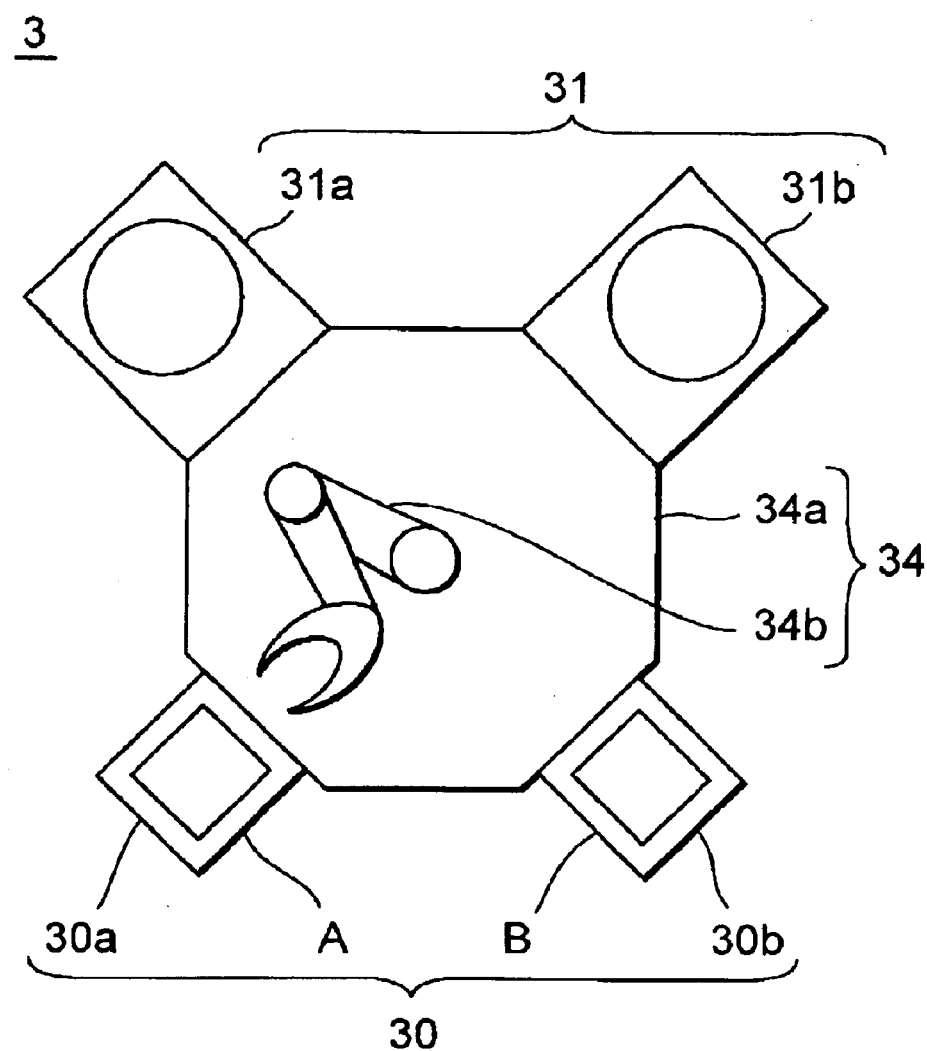
FIG. 5 sketches a configuration of a processing device used in the semiconductor fabricating method, according to the embodiment of the present invention.
Figure 6:
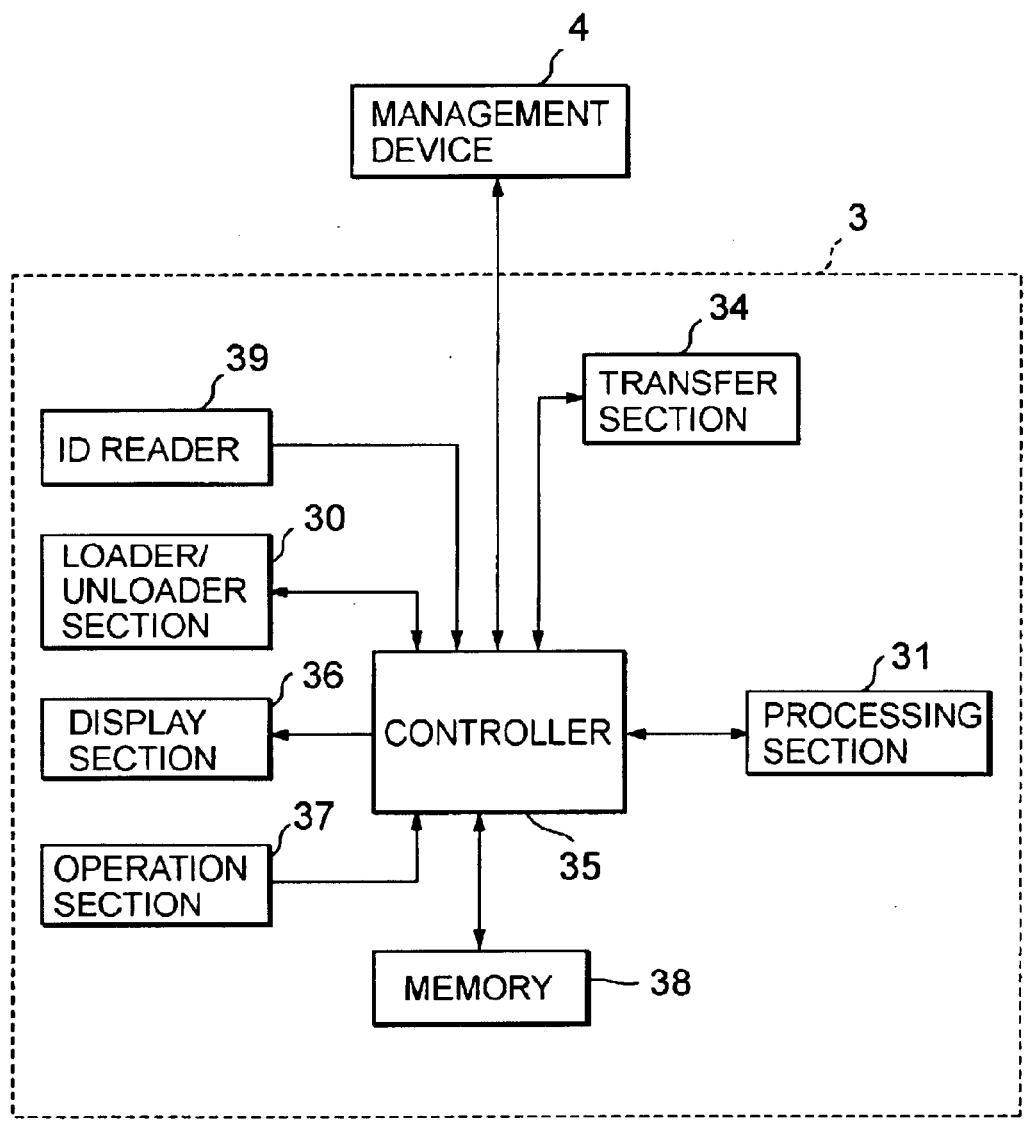
FIG. 6 shows in a block form the processing device of the embodiment.

Turning now to FIGS. 5 and 6, the processing device 3 used in the semiconductor fabricating method, according to a preferred embodiment of the present invention will be described, which comprises a loader/unloader section 30, a processing section 31, a transfer section 34, and a control unit including a controller 35 that controls these sections 30, 31 and 34.

The loader/unloader section 30 should include at least two loaders/unloaders 30a and 30b to carry out the semiconductor fabricating method according to the present invention as described later.

The processing section 31 has, for example, two processing chambers 31a and 31b for thin film formation after the lithography process is completed by the in-line stepper 1. The thin film formation may be implemented by etching, ion implantation, evaporation, sputtering, or any other suitable technique.

The transfer section 34, equipped with a transfer arm 34b arranged in a transfer chamber 34a, causes the transfer arm 34b to pick semiconductor wafers out of a cassette mounted on the loader/unloader section 30 one at a time, for transfer to the processing section 31, and returns each processed wafer in place in the cassette.

The control unit operative to control the above sections 30, 31 and 34 includes as its main component the controller 35 which can be a microcomputer, along with a display section 36, an operation section 37, a memory 38 and an ID reader 39.

The display section 36 provides information such as various settings visually on a display panel thereof as well as information such as warnings audibly with, for example, a buzzer or a signal tower thereof, as so instructed by the controller 35.

The operation section 37 is provided with various setting switches, a ten-key board, etc. so that an operator can enter processing information according to the kind of semiconductor wafer to be processed.

The memory 38 stores programs executed to carry out a particular process, such as thin film formation, for example.

The ID reader 39, which may comprise a bar code reader, reads a lot ID of a cassette (each cassette is so labeled as described below) before the cassette is mounted on the loader/unloader section 30, and also sends the read lot ID to the controller 35.

The controller 35, coupled via a bus to each of the loader/unloader section 30, processing section 31 and transfer section 34 for bidirectional data communication, controls overall operation of the processing device 3 by providing the relevant ones of the sections 30, 31 and 34 with proper control information based on related switch settings on the operation section 37 and specifications of any wafer to be processed which are recorded in the memory 38. Receiving cassette IDs from the ID reader 39, the controller 35 informs the management device 4 of the ID of any cassette ready to be processed.

As mentioned above, the management device 4 is responsible for managing processing and inspection information about semiconductor wafers, and hence arranged to be communicatable also with the controller 35 to give it specific control instructions.

In the processing device 3 having the above configuration, when a cassette accommodating semiconductor wafers is mounted on the loader/unloader section 30, the transfer arm 34b of the transfer section 34 takes a wafer out of the cassette for delivery to the processing section 31, where the wafer is etched, ion-implanted, evaporated or sputtered to have thin films formed thereon. The wafer so processed by the processing section 31 is then put back to the cassette on the loader/unloader section 30.

The above steps are repeated for the rest of the semiconductor wafers in the cassette.

Likewise in the in-line stepper 1 and the inspection device s 2, it is arranged in the processing device 3 such that a cassette A accommodating semiconductor wafers is mounted on one loader/unloader 30a and an empty cassette B on another loader/unloader 30b to allow selected ones of the processed wafers to be put back in the empty cassette when the controller 35 is so instructed by the management device 4.

The semiconductor fabricating method according to the present invention utilizing this arrangement and the ID reader 39 will be described below.

Figure 7:
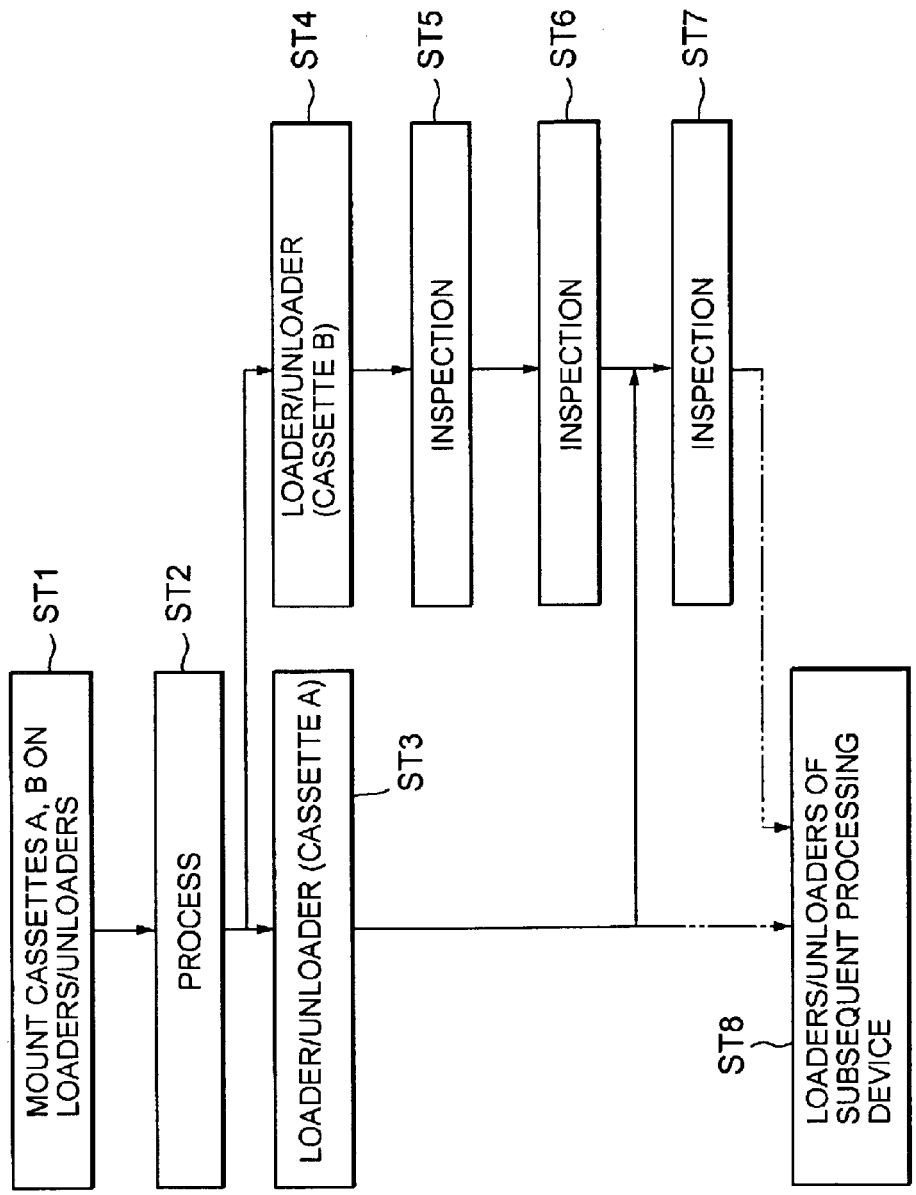
FIG. 7 shows a process flow of semiconductor wafers in cassettes for implementing the semiconductor fabricating method according to the embodiment.

Turning now to a process flow shown in FIG. 7 and a sketch of FIG. 8, preferred embodiments will be described of the semiconductor fabricating method according to the present invention. In these embodiments, some of semiconductor wafers are inspected while the rest of the semiconductor wafers are subjected to a semiconductor fabricating process, such as the lithography process, using the above-described semiconductor fabricating system according to the preferred embodiment of the present invention.

Figure 8:
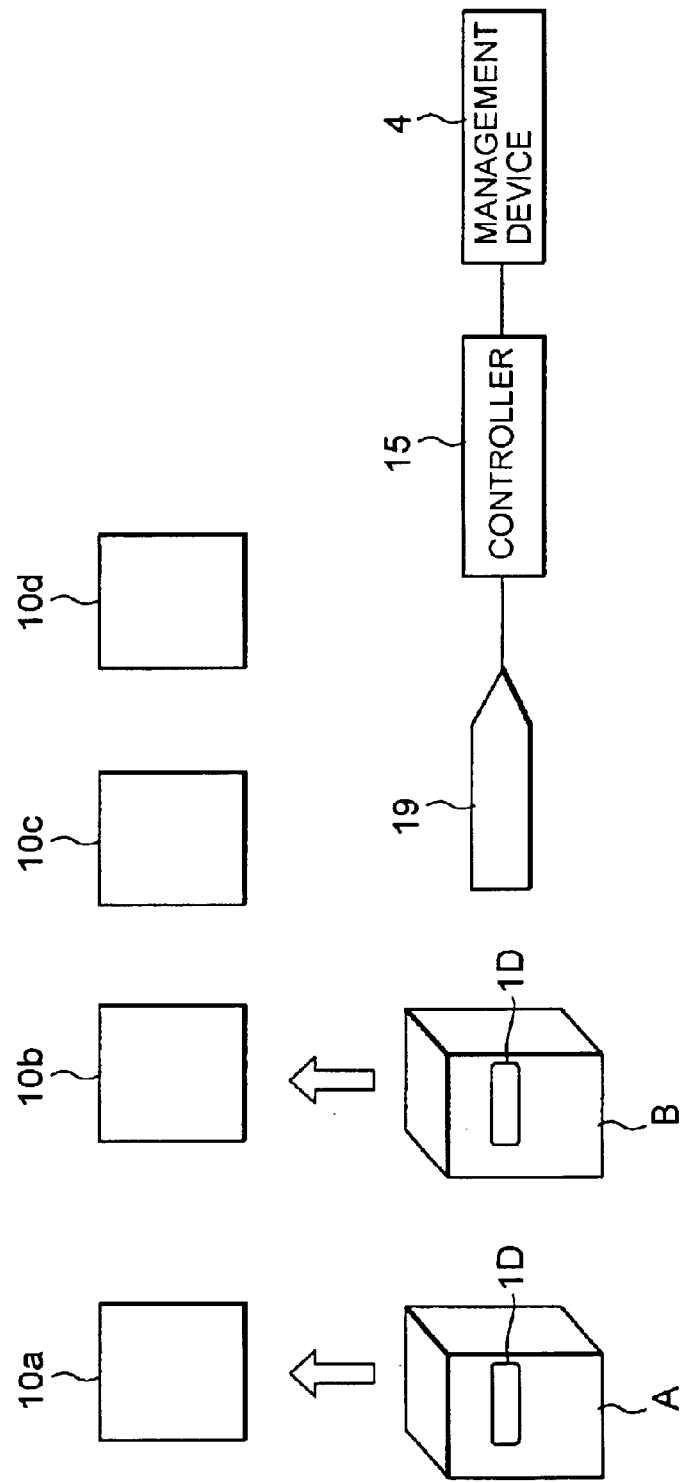
FIG. 8 illustrates how each cassette is mounted on a loader/unloader.
Figure 9:
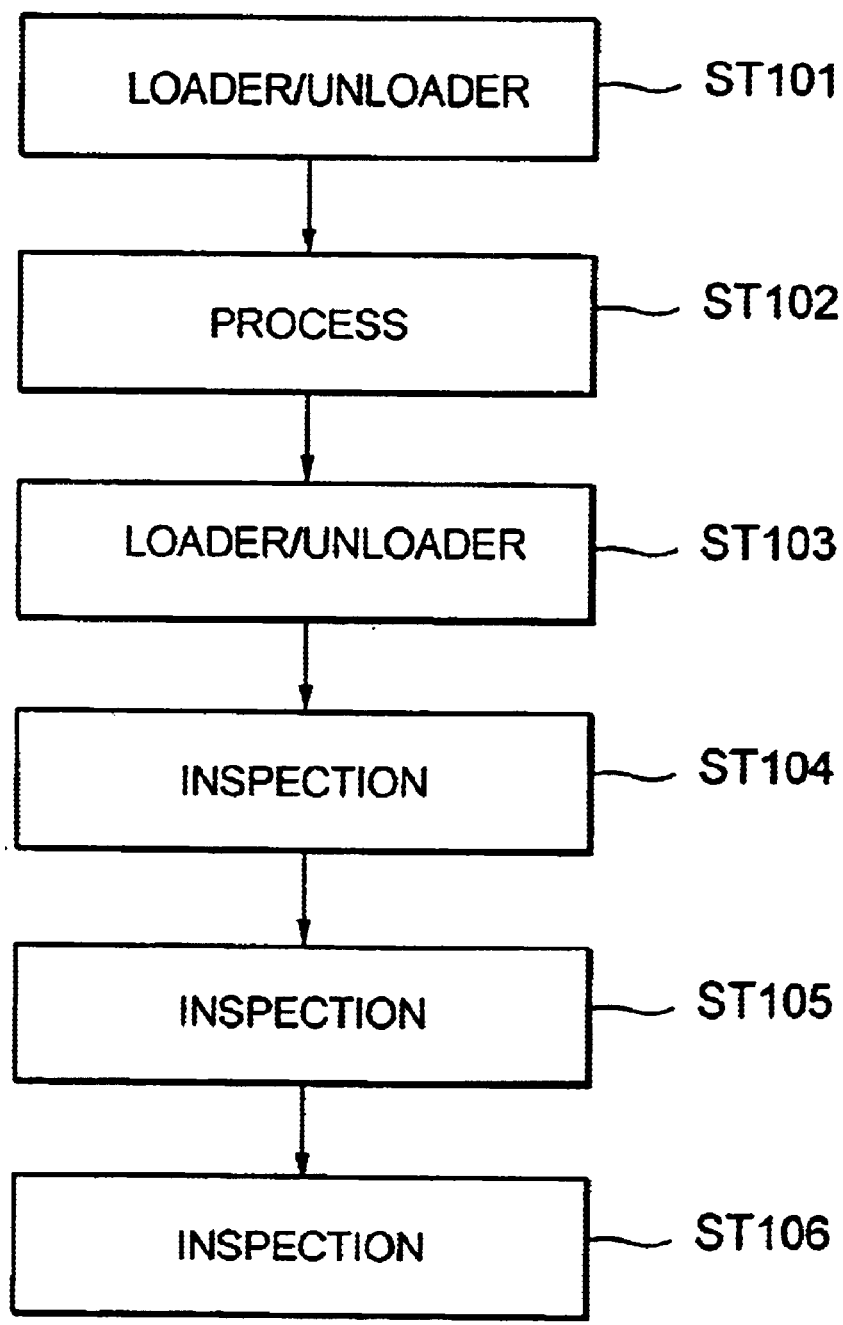
FIG. 9 shows a process flow of semiconductor wafers in a cassette according to a conventional semiconductor fabricating method.

In the preferred embodiments, first, in step ST1, a cassette A for accommodating semiconductor wafers to be subjected to a lithography step is mounted on the loader/unloader 10a and an empty cassette B for receiving some selected sample wafers on the loader/unloader 10b of the in-line stepper 1, as shown in FIG. 8.

Each cassette A or B is labeled with a bar code or a writable/readable tag indicative of a lot ID as referred to above, and the lot ID is read by the ID reader 19 to be sent to the management device 4 by the control section 15 at the time the cassette is mounted on the corresponding loader/unloader.

When receiving the ID of the cassette A, the management device 4 designates, prior to the lithography process, some of the semiconductor wafers in the cassette A as sample wafers for inspection based on previously stored information about the cassette A, and instructs the controller 15, as position information, to load the designated wafers from particular slots (e.g., first, third and fifth slots) of the cassette A into particular slots of the cassette B after completion of the lithography process.

The management device 4 stores for management both the lot IDs of the cassettes A and B and the position information about their source and designation slots given to the controller 15 as its instruction.

Next, in step ST2, the in-line stepper 1 processes each semiconductor wafer lithographically by resist coating, exposure and development.

During the process, the controller 15 directs the transfer section 14 as instructed by the management device 4. In one example, when the in-line stepper 1 has finished processing a fifth one of 25 semiconductor wafers in the cassette A, the first, third and fifth wafers are loaded into first, third and fifth slots of the cassette B for inspection as sample wafers (step ST4). Meanwhile, the in-line stepper 1 is continuously processing a sixth and subsequent wafers in the cassette A.

In step ST4, after all the sample wafers, which are the designated ones of the processed wafers, are properly loaded into the cassette B, the transfer section 14 of the in-line stepper 1 takes the cassette B from the loader/unloader 10b for transfer to the first inspection device 2.

The previously mentioned buzzer, signal tower or the like arranged in the in-line stepper 1 gives a cue to indicate an operator that the cassette B is readily retractable from the loader/unloader 10b. Thus, the operator, knowing that all the sample wafers have been properly loaded into the cassette B, can forward the cassette B immediately to the first inspection device 2.

Next, the first and other inspection device s 2, in turn, mount the sample wafer accommodating cassette B on their loader/unloader sections 20 for prescribed diagnosis (steps ST5, ST6 and ST7).

At the time of the mounting, each ID reader 29 of the inspection device 2 reads the lot ID of the cassette B to inform the management device 4 of this ID via the controller 25.

The first inspection device 2 measures dimensions of patterns formed on the sample wafers with a scanning electron microscope (SEM) (step ST5). Then, the second inspection device 2 evaluates their overlay accuracy (step ST6). Finally, visual inspection is carried out to find any damage, etc. on the patterns using the third inspection device 2 (step ST7). Each inspection device 2 sends its inspection results to the management device 4 via its controller 25.

Upon receipt of the results, the management device 4 compares the already received ID of the cassette B with the stored ID of the cassette B to identify the cassette B mounted on the inspection device 2. Since the ID of the cassette B is associated with that of the cassette A, the management device 4 accepts the inspection results as those for the semiconductor wafers in the cassette A upon identification of the cassette B on each inspection device as the cassette B associated with the cassette A.

Here, if all the three inspection devices 2 have finished their inspections before the in-line stepper 1 finishes its lithographic process on the rest of the semiconductor wafers in the cassette A, then the inspected cassette B is mounted on the loader/unloader 10*b* of the in-line stepper 1 to allow the inspected sample wafers to be returned to the cassette A on the loader/unloader 10*a* when the lithographic process is finished.

If, on the other hand, the in-line stepper 1 has finished processing the rest of the wafers before completion of the inspections, then the sample wafers may be reunited with the rest of the semiconductor wafers in the cassette A, after completion of the inspections, either on the loader/unloader section 20 of the inspection device 2 or on the loader/unloader section 30 of the processing device 3 for the subsequent process, as more specifically explained below.

In one example, if the third inspection is not started when the in-line stepper 1 has completed its lithography on the rest of the semiconductor wafers in the cassette A (step ST3), then the in-line stepper 1 causes its transfer section 14 to take the cassette A out of its loader/unloader 10*a* to forward the cassette A to the third inspection device 2, where the cassette A is mounted on one of the loaders/unloaders 20 and the cassette B will then be mounted on another one of the loaders/unloaders 20 to allow the ID reader 29 to read the IDs of both the cassettes A and B and inform the management device 4 of the read IDs.

The management device 4, in turn, identifies the cassettes A and B by comparing their IDs just received with their IDs which are previously stored as its management information, and when both cassettes are found to be identical, directs the controller 25 to load, after completion of the third inspection, the sample wafers in the cassette B into the cassette A according to the position information about their source and destination slots which is also stored as its management information.

When the third inspection is completed, the transfer section 24 puts the sample wafers in the cassette B back in the original positions in the cassette A.

If all the inspection device s 2 judge that the sample wafers meet quality specifications, then the semiconductor wafers reunited in the cassette A are forwarded to the subsequent processing device 3 (step ST8). Otherwise, no further processing is carried out for the cassette A.

In another example, if all the inspections are completed or the third inspection has been started and the sample wafers are found to be acceptable so far when the in-line stepper 1 has completed its lithography on the rest of the semiconductor wafers in the cassette A (step ST3), then the in-line stepper 1 causes its transfer section 14 to take the cassette A out of its loader/unloader 10*a* to ship the cassette A directly to the processing device 3, where the cassette A is mounted on one of the loaders/unloaders 30 and immediately processed (step ST8), and the cassette B will then be mounted on another one of the loaders/unloaders 30 whenever ready.

At the time of the mounting, the ID reader 39 of the processing device 3 reads the IDs of both the cassettes A and B and sends the read IDs to the management device 4.

The management device 4, in turn, compares the received IDs with the previously stored IDs to identify the cassettes A and B, and instructs the controller 35 to move the inspected sample wafers in the cassette B to the cassette A according to the stored position information about their source and destination slots.

Then, the transfer section 34 of the processing device 3 puts the sample wafers back to the cassette A in place as instructed.

It is to note that if the inspected wafers are judged to be defective, the processing device 3 halts its processing on the wafers in the cassette A.

In this way, once judged acceptable in the course of a semiconductor fabricating process, semiconductor wafers are subjected to subsequent processes. When a lithography process is interposed between processes, inspection is carried out in parallel with the lithography process itself similarly under the above-described semiconductor fabricating method.

The semiconductor fabricating method according to the preferred embodiments of the present invention allows for reduced turn around time (TAT) in semiconductor fabrication by parallel operation in which some of semiconductor wafers grouped as a processing lot are taken as samples and inspected while the rest of them are continuously being processed.

The parallel operation is especially advantageous in a process involving a plurality of inspections, such as a lithography process, in that additional investment can be saved.

That is, if the lithography process ends during inspection and a processed cassette accommodating processed wafers excluding sample wafers is unloaded from a lithography processing apparatus, then a loader/unloader section of either an inspection apparatus or a subsequent processing apparatus can be utilized to reunite the sample wafers in an inspected cassette with the processed wafers in the processed cassette.

Thus, the semiconductor fabricating method according to the present invention with its feature of parallel operation does not require any special transfer equipment, and hence contributes to saving investment.

The semiconductor fabricating method according to the present invention further achieves reduced rejects. Of, for example, 25 wafers grouped as a lot currently being processed, if some are selected for inspection and when found defective during inspection, proper measures can be taken immediately on the 25 wafers in the lot to reduce rejects, and hence improve production yield.

The present invention is not limited to the above-disclosed embodiments.

For example, the semiconductor fabricating method according to the present invention may be likewise applicable to semiconductor fabricating processes involving time-consuming inspection, other than the lithography process.

Furthermore, the above-disclosed configurations of the in-line stepper 1, inspection device s 2, and processing device 3 are merely exemplary. What matters is the use of their loaders/unloaders to return inspected sample wafers to the cassette where they were originally accommodated.

Although the invention having been described hereinabove in its preferred form with a certain degree of particularity, other changes, variations, combinations and sub-combinations are possible therein. It is therefore to be understood that any modifications will be practiced otherwise than as specifically described herein without departing from the scope and spirit of the present invention.

What is claimed is:

1. A method of fabricating semiconductors in parallel with the inspection of said semiconductors comprising the steps of:

(a) providing a first processing apparatus and a first container containing a number of semiconductor wafers the first container labeled with a first identifier and a second container labeled with a second identifier, and storing said first and second identifiers;

(b) while the first processing apparatus is submitting said semiconductor wafers from the first container to a first process, loading selected ones of post-processed semiconductor wafers into said second container as sample wafers for inspection;

(c) performing inspection of said sample wafers from the second container;

(d) identifying said first and second containers by comparison of identifiers on said containers with identifiers previously stored into memory; and (e) causing a second processing apparatus to submit semiconductor wafers from both containers to a second process, and then returning all semiconductor wafers after submission to said second process back to said first container.

2. A method according to claim 1, wherein said step (b) comprises storing position information about where said sample wafers were positioned in the first container, and said step (e) comprises retrieving said stored position information and identifiers of said first and second containers in order to return said sample wafers after submission to said second process to their original position in said first container.

3. A method according to claim 1, wherein said step (c) comprises identifying said second container by comparison of said identifier thereof with said stored container identifier in order to store inspection results of said sample wafers.

4. A method according to claim 1, wherein random selection of semiconductors to be used as sample wafers in the inspection process is employed.

5. A method of fabricating semiconductors in parallel with the inspection of said semiconductors comprising the steps of:

(a) providing a processing apparatus and a first container containing a predetermined number of semiconductor wafers and labeled with a first identifier and a second container labeled with a second identifier, and storing said first and second identifiers;

(b) while the processing apparatus is submitting said semiconductor wafers to a process, loading preselected ones of post-processed semiconductor wafers into said second container as sample wafers for inspection;

(c) causing an inspection apparatus to submit said sample wafers to an inspection, and returning inspected sample wafers back to said first container.

6. A method according to claim 5, wherein said step (b) comprises storing position information about where said sample wafers were positioned in the first container, and said step (c) comprises retrieving said scored position information and container identifiers of said second and first containers in order to return the inspected sample wafers to their original positions in said first container.

7. A method according to claim 5, wherein said step (c) comprises identifying said second container by comparison of said identifier thereof with said stored second identifier in order to store inspection results of said sample wafers.

8. A method according to claim 5, further comprising the step of utilizing another inspection apparatus to submit said inspected sample wafers to another inspection, after said step (b).

9. A method according to claim 4, wherein random selection of semiconductors to be used as sample wafers in the inspection process is employed.

* * * * *